US008485204B2

(12) United States Patent
Obweger et al.

(10) Patent No.: US 8,485,204 B2
(45) Date of Patent: Jul. 16, 2013

(54) CLOSED CHAMBER WITH FLUID SEPARATION FEATURE

(75) Inventors: Rainer Obweger, Lind Im Drautal (AT); Andreas Gleissner, Radenthein (AT)

(73) Assignee: Lam Research AG, Villach (AT)

( * ) Notice: Subject to any disclaimer, the term of this patent is extended or adjusted under 35 U.S.C. 154(b) by 352 days.

(21) Appl. No.: 12/787,196

(22) Filed: May 25, 2010

(65) Prior Publication Data

US 2011/0290283 A1  Dec. 1, 2011

(51) Int. Cl.
*B08B 3/04* (2006.01)
(52) U.S. Cl.
USPC ...................................... 134/104.2
(58) Field of Classification Search
USPC ...................................... 134/104.2
See application file for complete search history.

(56) References Cited

U.S. PATENT DOCUMENTS

| | | | |
|---|---|---|---|
| 4,903,717 A | 2/1990 | Sumnitsch | |
| 5,513,668 A | 5/1996 | Sumnitsch | |
| 6,485,531 B1 | 11/2002 | Schoeb | |
| 6,793,769 B2 * | 9/2004 | Kajino et al. | 156/345.55 |
| 6,872,254 B2 | 3/2005 | Shirley | |
| 2008/0057219 A1 | 3/2008 | Kim et al. | |
| 2009/0101285 A1 | 4/2009 | Park et al. | |

FOREIGN PATENT DOCUMENTS

| | | |
|---|---|---|
| WO | 2007070702 A2 | 6/2007 |
| WO | 2007/101764 | 9/2007 |

OTHER PUBLICATIONS

International Search Report, dated Feb. 21, 2012, from corresponding PCT application.
Written Opinion, dated Feb. 21, 2012, from corresponding PCT application.

* cited by examiner

*Primary Examiner* — Michael Barr
*Assistant Examiner* — Jason Ko
(74) *Attorney, Agent, or Firm* — Young & Thompson

(57) ABSTRACT

Selective recovery of excess process fluid from within a closed process chamber is achieved by providing a magnetically drive ring chuck and at least one process fluid collector within the closed process chamber, with the ring chuck and the fluid collector being vertically movable relative to each other.

13 Claims, 10 Drawing Sheets

US 8,485,204 B2

CLOSED CHAMBER WITH FLUID SEPARATION FEATURE

BACKGROUND OF THE INVENTION

1. Field of the Invention

The invention relates generally to an apparatus for treating surfaces of wafer-shaped articles, such as semiconductor wafers, wherein one or more treatment fluids may be recovered from within a closed process chamber.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531. Treatment fluids which are driven outwardly from the edge of a rotating wafer due to centrifugal action are delivered to a common drain for disposal.

SUMMARY OF THE INVENTION

The present inventors have discovered that, in chucks of the type described above, various treatment fluids may advantageously be separately recovered from within a closed process chamber so that the recovered fluids may be recycled or reused.

According to the present invention, a device for holding wafer-shaped articles, such as semiconductor wafers, within a closed process chamber is equipped with two or more distinct fluid collectors, wherein the wafer support and fluid collectors are movable relative to each other via a magnetic coupling which is actuated from outside of the closed process chamber, such that process fluid emanating from the wafer surface can be selectively directed to a given fluid outlet.

BRIEF DESCRIPTION OF THE DRAWINGS

Other objects, features and advantages of the invention will become more apparent after reading the following detailed description of preferred embodiments of the invention, given with reference to the accompanying drawings, in which:

FIG. 1b is a cross-sectional perspective view of the process chamber of FIG. 1a;

FIG. 2b is a cross-sectional view of the process chamber of FIG. 2a;

DETAILED DESCRIPTION OF PREFERRED EMBODIMENTS

Figure 1A:
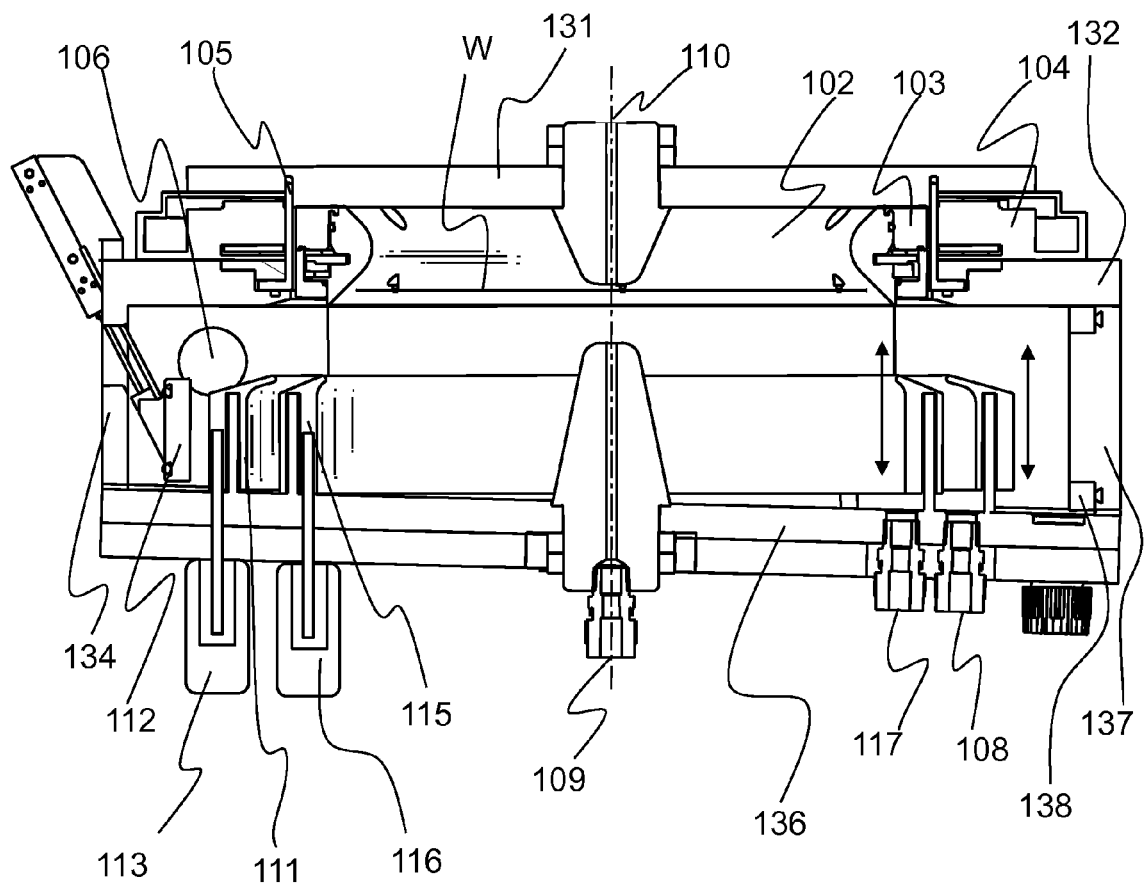
FIG. 1a is a cross-sectional side view of a process chamber according to an embodiment of the invention, shown in a wafer loading/unloading status.
Figure 1B:
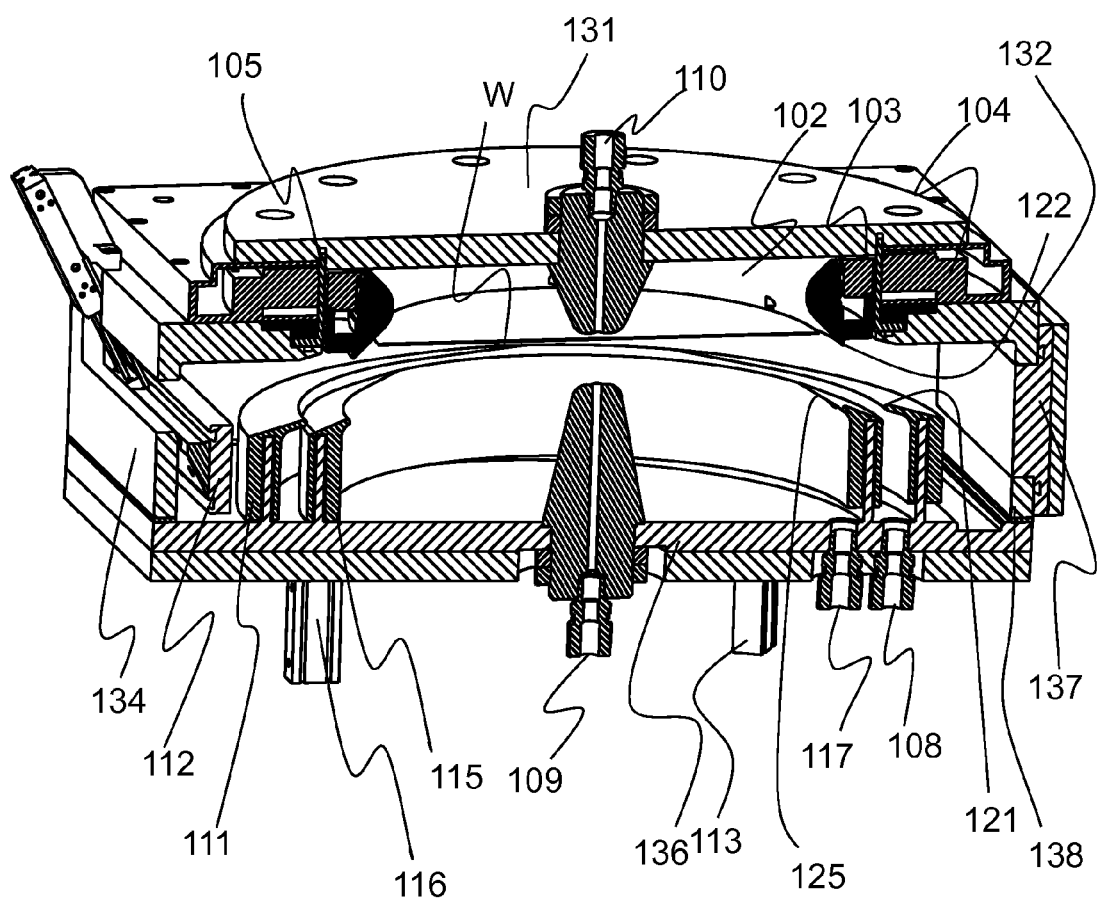

Referring to FIGS. 1a and 1b, a closed process chamber is defined by an upper chamber having an open bottom region which is seated atop a larger lower chamber having an open top region, as is described in further detail below.

The perimeter of the upper chamber is defined by a cylindrical chamber wall (105). The cylindrical chamber wall (105) comprises a vertically oriented cylindrical wall having an upper end and an outwardly extending radial flange at its lower end.

An inner cover plate (131) is seated upon the upper end of the cylindrical chamber wall (105) so as to provide a closed top surface of the upper chamber, extending within the interior of the cylindrical chamber wall (105). The inner cylindrical plate (131) also extends radially outwardly from the upper end of the cylindrical chamber wall (105). Thus, the upper chamber of the closed process chamber comprises an interior region formed below the inner cover plate (131) and within the cylindrical chamber wall (105).

The lower chamber of the closed process chamber, which is larger than the upper chamber, is formed from below by a bottom plate (136). A frame (138) comprises vertical walls which are joined about the periphery of the bottom plate (136) so as to form vertically extending sidewalls of the lower chamber. A wafer loading and unloading access door (134) is provided within one wall of the frame (138) and a maintenance access door is provided within another wall of the frame (138).

Opposite the bottom plate (136), the frame (138) is joined to an inwardly extending annular cover plate (132), so as to form an annular top surface of the lower chamber. Thus, the lower chamber of the closed process chamber comprises an interior region formed above the bottom plate (136), within the frame (138) and below the annular cover plate (132).

The annular cover plate (132) is seated at its inner peripheral edge against the horizontally extending flange of the lower end of the cylindrical chamber wall (105), so as join the upper and lower chambers to form the closed process chamber.

A ring chuck (102) is located within the upper chamber. Ring chuck (102) is adapted to rotatably support a wafer (W). Preferably, ring chuck (102) comprises a rotatable drive ring having a plurality of eccentrically movable gripping members for selectively contacting and releasing the peripheral edge of a wafer.

In the embodiment shown in FIGS. 1a and 1b, the ring chuck (102) comprises a ring rotor (103) provided adjacent to the interior surface of the cylindrical chamber wall (105). A stator (104) is provided opposite the ring rotor adjacent the outer surface of the cylindrical chamber wall (105). The rotor (103) and stator (104) serve as a motor by which the ring rotor (and thereby a supported wafer) may be rotated through an active magnetic bearing. For example, the stator (104) can comprise a plurality of electromagnetic coils or windings which may be actively controlled to rotatably drive the ring chuck (102) through corresponding permanent magnets provided on the rotor (103). Axial and radial bearing of the ring chuck (102) may be accomplished also by active control of the stator or by permanent magnets. Thus, the ring chuck (102) may be levitated and rotatably driven free from mechanical contact. Alternatively the rotor may be held by a passive bearing where the magnets of the rotor are held by corresponding high-temperature-superconducting magnets (HTS-magnets) that are circumferentially arranged on an outer rotor outside the chamber. With this alternative embodiment each magnet of the ring rotor is pinned to its corresponding HTS-magnets of the outer rotor. Therefore the inner rotor makes the same movement as the outer rotor without being physically connected.

The inner cover plate (131) is perforated by a medium inlet (110). Similarly, the bottom plate (136) is perforated by a medium inlet (109). During processing of a wafer, processing fluids may be directed through medium inlet (109) and/or (110) to a rotating wafer in order to perform various processes, such as etching, cleaning, rinsing, and any other desired surface treatment of the wafer undergoing processing.

The ring chuck (102) includes a trailing edge (122) which is oriented at a downward angle directed radially outward from the rotational axis of the ring chuck (102). Thus, centrifugal action created by a spinning wafer causes excess process fluid, which has been dispensed through medium inlet (109) or (110), to be driven against an angled surface of the ring chuck (102) and directed in a downward and outward direction from the trailing edge (122).

Within the lower chamber of the closed process chamber, one or more vertically movable splash guards (111, 115) are provided. In FIG. 1b two circular splash guards (111 and 115) are shown although it will be appreciated that any desired number of splash guards may be provided and are contemplated by this disclosure, the actual number of splash guards depending in part upon the number of different process fluids which are intended to be separately collected.

The outer splash guard (111) is positioned concentrically about the inner splash guard (115). Thus, the inner splash guard (115) defines an inner process fluid collector within its interior. An outer process fluid collector is defined by an annular region formed between the outer surface of the inner splash guard (115) and the inner surface of the outer splash guard (111).

Associated with each such fluid collector a drain is provided for delivering collected process media from the respective fluid collector to outside the closed process chamber. As shown in FIG. 1b, drain (117) extends through the base plate (136) and opens to the inner fluid collector, while drain (108) extends through the base plate (136) and opens to the outer fluid collector. Preferably, base plate (136) is slanted relative to a horizontal plane toward each of the drains (108) and (117), such that fluid that is collected by the inner or outer fluid collector is caused to flow along the base plate (136) toward the drains (117) and (118).

As shown in FIG. 1a, an exhaust opening (106) leading to the closed process chamber also is provided to facilitate the flow of air and/or other gases and fumes.

Each splash guard is independently movable in the vertical direction. Accordingly, each splash guard can selectively be raised and/or lowered relative to the ring chuck (102), and relative to any other splash guard, such that excess process fluid emanating from the trailing edge of the ring chuck (122) is directed toward a selected fluid collector.

Figure 1C:
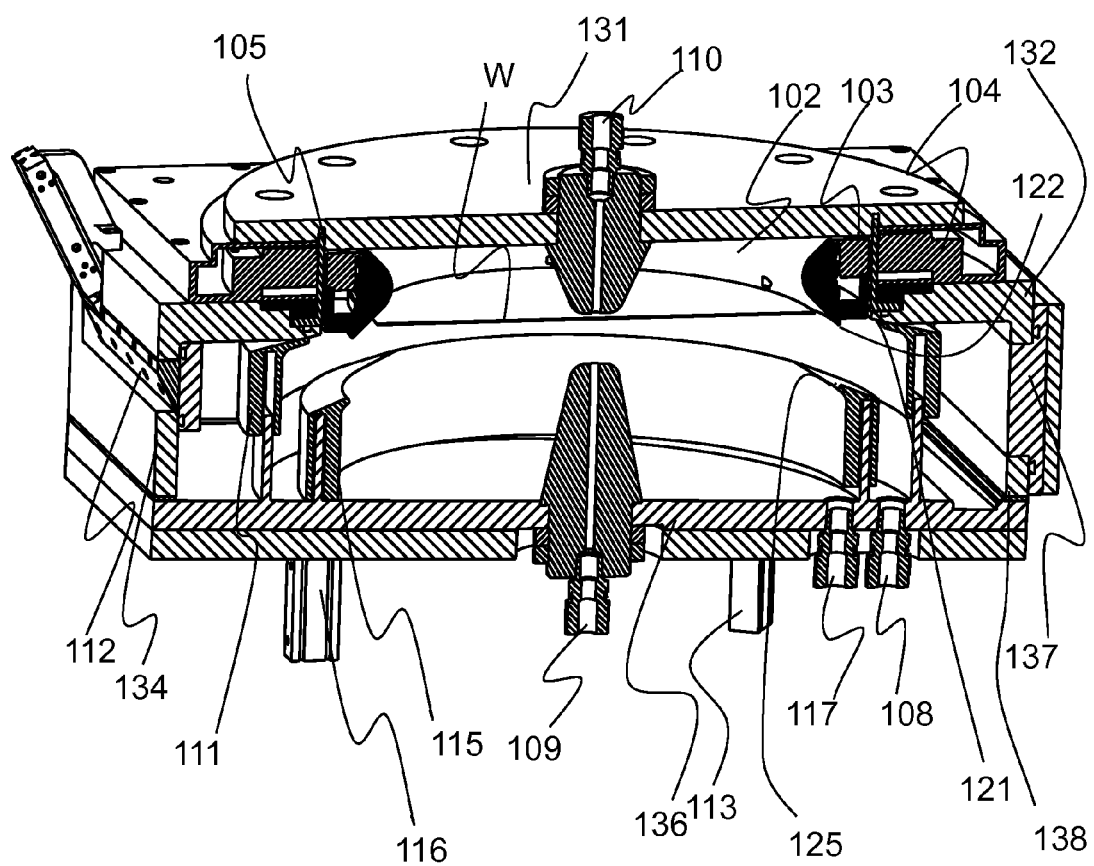
FIG. 1c is a cross-sectional perspective view of the process chamber of FIG. 1a, shown in a first process fluid collection status.

In FIG. 1c, the outer splash guard (111) is depicted in an elevated status relative to the inner splash guard (115), such that excess process fluid emanating from the trailing edge (122) of the ring chuck (102) is directed against the inner surface of the outer splash guard (111) and into the outer fluid collector. Thus, excess fluid from the surface of a wafer undergoing processing can be selectively recovered through drain (108) and optionally recycled or reused.

Preferably, and as shown in FIG. 1c, the outer splash guard can be elevated a distance such that an inwardly facing upper lip is seated against the annular cover plate (132). In this position, the regions of the closed process chamber outside of the fluid collector are less exposed to any aggressive or caustic fumes derived from the process fluid being collected.

Figure 1D:
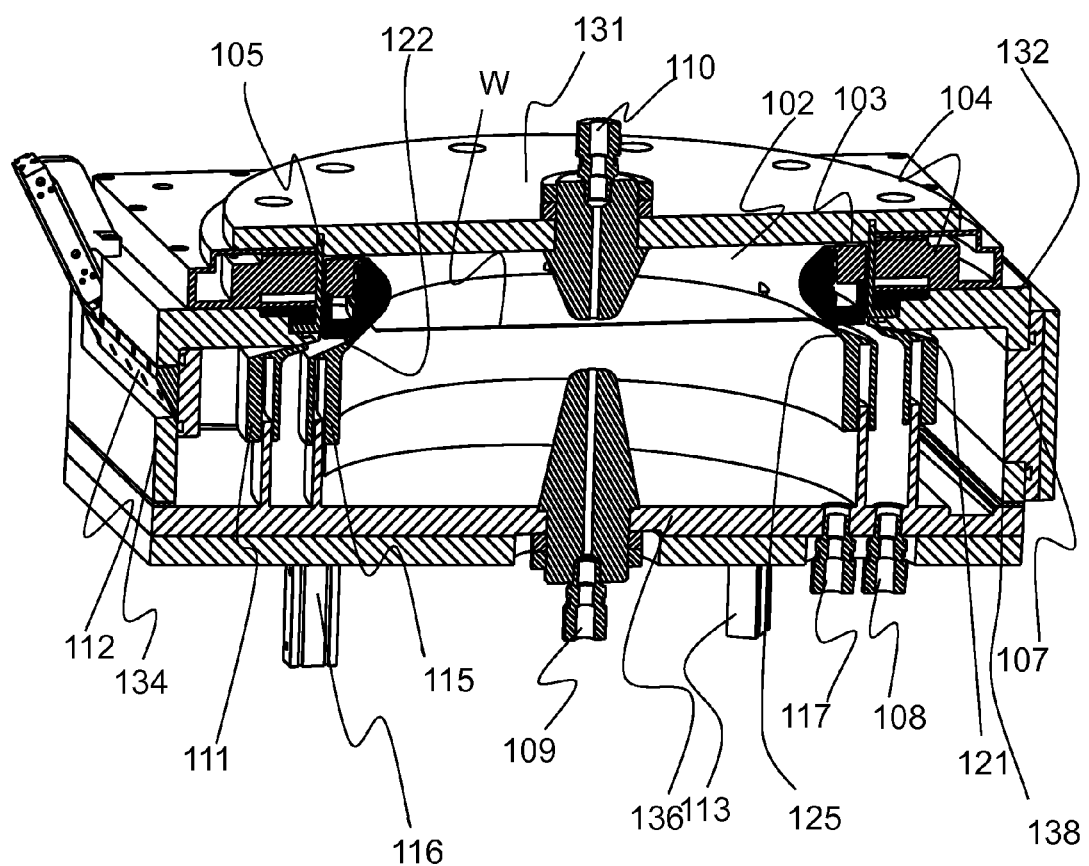
FIG. 1d is a cross-sectional perspective view of the process chamber of FIG. 1a, shown in a second process fluid collection status.
Figure 1E:
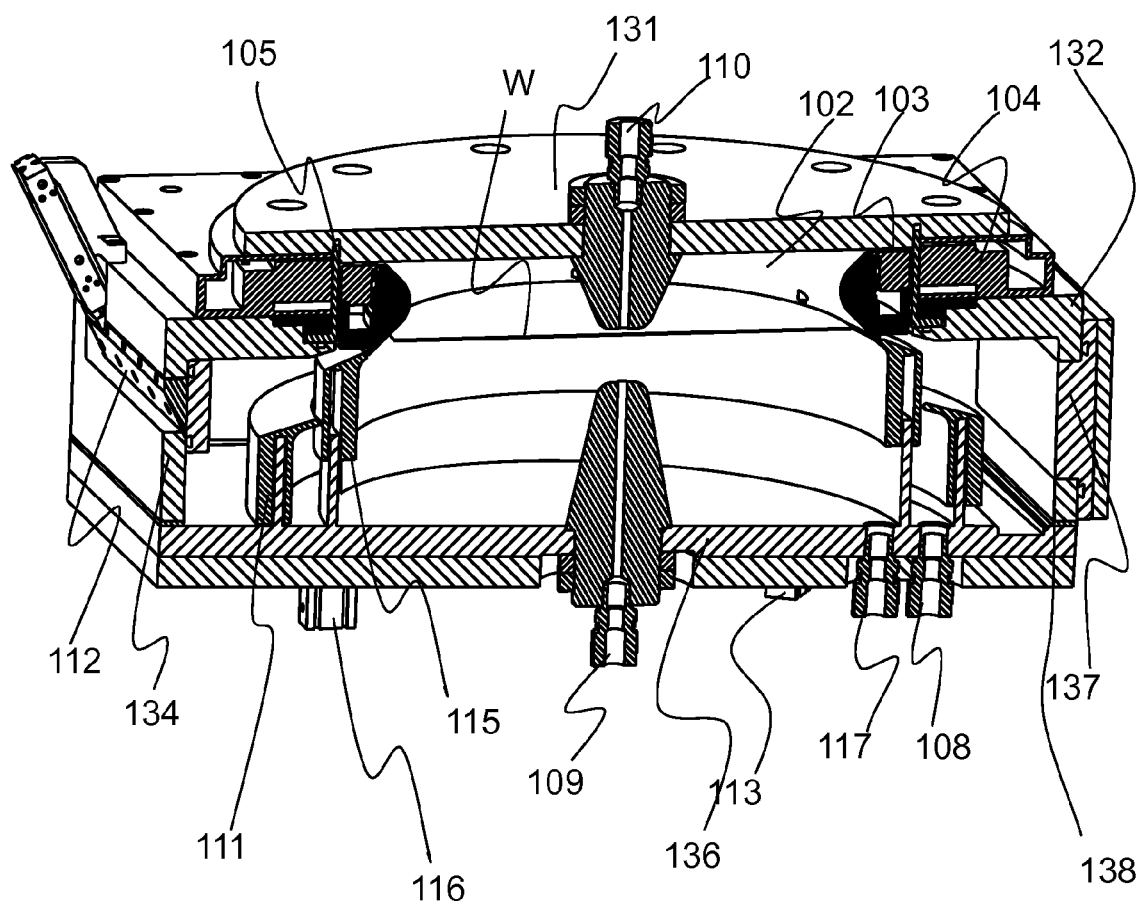
FIG. 1e is a cross-sectional perspective view of the process chamber of FIG. 1a, shown in an alternative second process fluid collection status.

In FIG. 1e, the inner splash guard (115) is depicted in an elevated status, such that excess process fluid emanating from the trailing edge (122) of the ring chuck (102) is directed against the inner surface of the inner splash guard (115) and into the inner fluid collector. Thus, excess fluid from the surface of a wafer undergoing processing can be selectively recovered through drain (117) and optionally recycled or reused.

Preferably, and as shown in FIG. 1e, the inner splash guard can be elevated a distance such that an inwardly facing upper lip is sealed against the trailing edge (122) of the ring chuck (102). In this position, the regions of the closed process chamber outside of the fluid collector are less exposed to any aggressive or caustic fumes derived from the process fluid being collected. It will further be appreciated that, when the inner splash guard is elevated to facilitate collection of excess process fluid in the inner fluid collector, the outer splash guard can also be elevated so that protection of the regions of the closed process chamber outside of the fluid collectors from any aggressive or caustic fumes or fluids may be enhanced, as depicted in FIG. 1d.

Accordingly, by selective vertical movement of one or more splash guards, different process fluids can at different times be isolated and separately recovered from the closed process chamber. Thus, for example, process chemicals such as acids, bases and oxidizing liquids may each be recovered separately and without unnecessary dilution by other process fluids such as etching, cleaning or rinsing liquids, as well as gases.

Still referring to FIGS. 1a-1e, one or more actuators are provided outside of the closed process chamber in order to facilitate the selective and independent movement of each splash guard. For example, in FIG. 1a, an actuator (113) is operatively associated with the outer splash guard (111) and another actuator (116) is operatively associated with the inner splash guard (115). Preferably three actuators as provided for each splash guard, although the number of actuators used will depend in part upon the geometric shape of the associated splash guard.

Actuators (113, 116) are provided with permanent magnets which correspond with permanent magnets carried by the splash guards (111, 116). Thus, selective vertical movement of each splash guard can be provided by the actuators through magnetic couples formed by the opposing sets of permanent magnets.

Figure 1F:
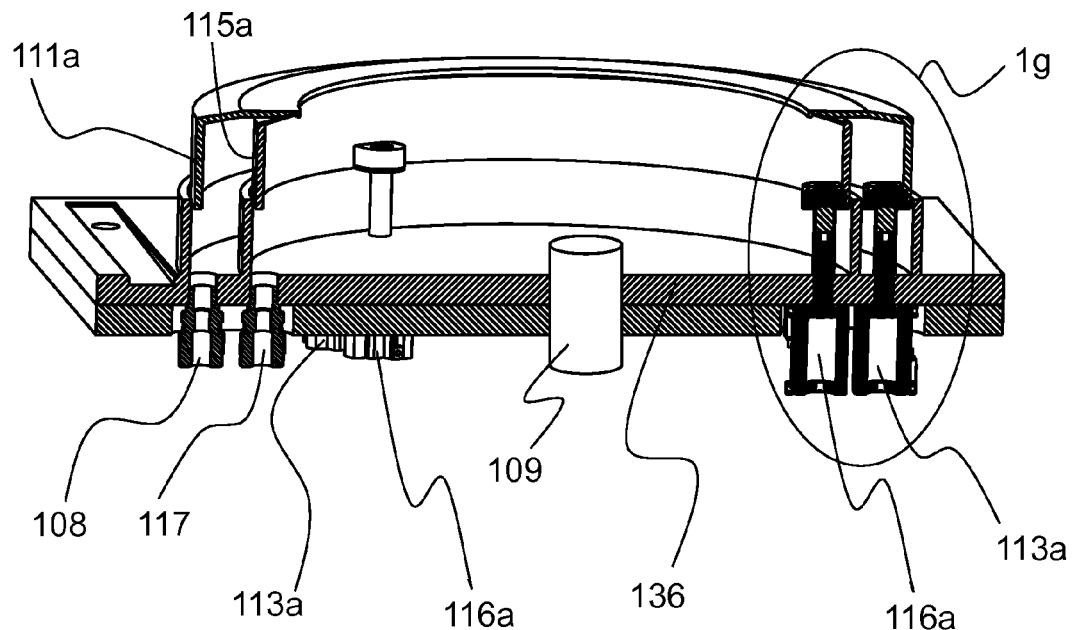
FIG. 1f is a partial cross-sectional perspective view of a process chamber according to another embodiment of the invention.
Figure 1G:
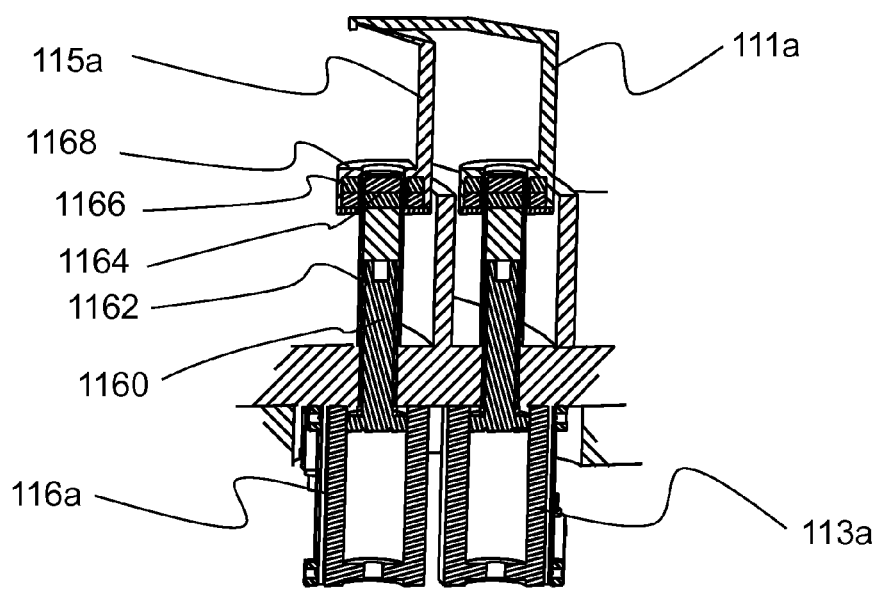
FIG. 1g is an enlarged sectional view of a preferred fluid collector profile and drive assembly.
Figure 2A:
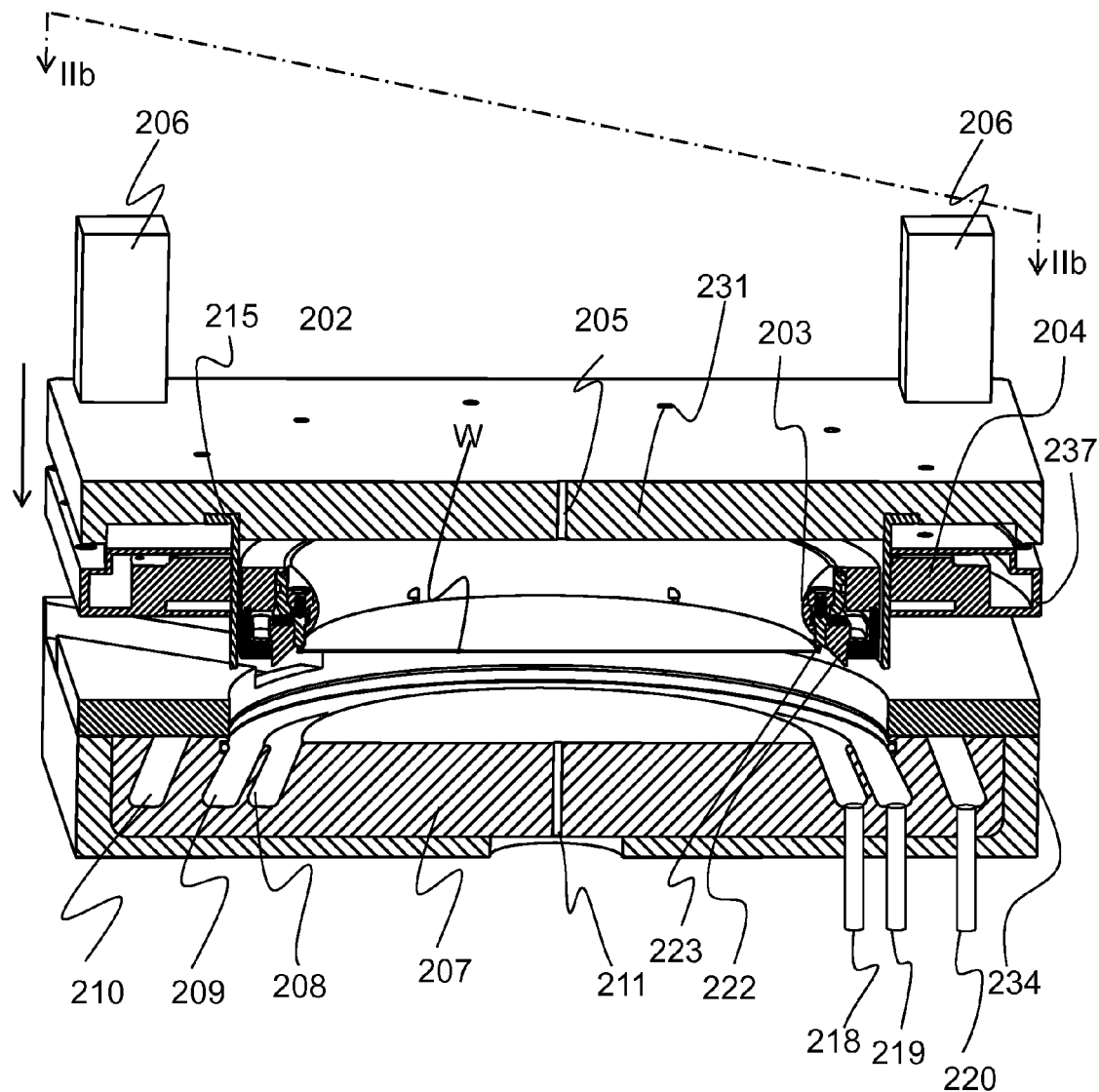
FIG. 2a is a cross-sectional perspective view of a process chamber according to another embodiment of the invention.
Figure 2B:
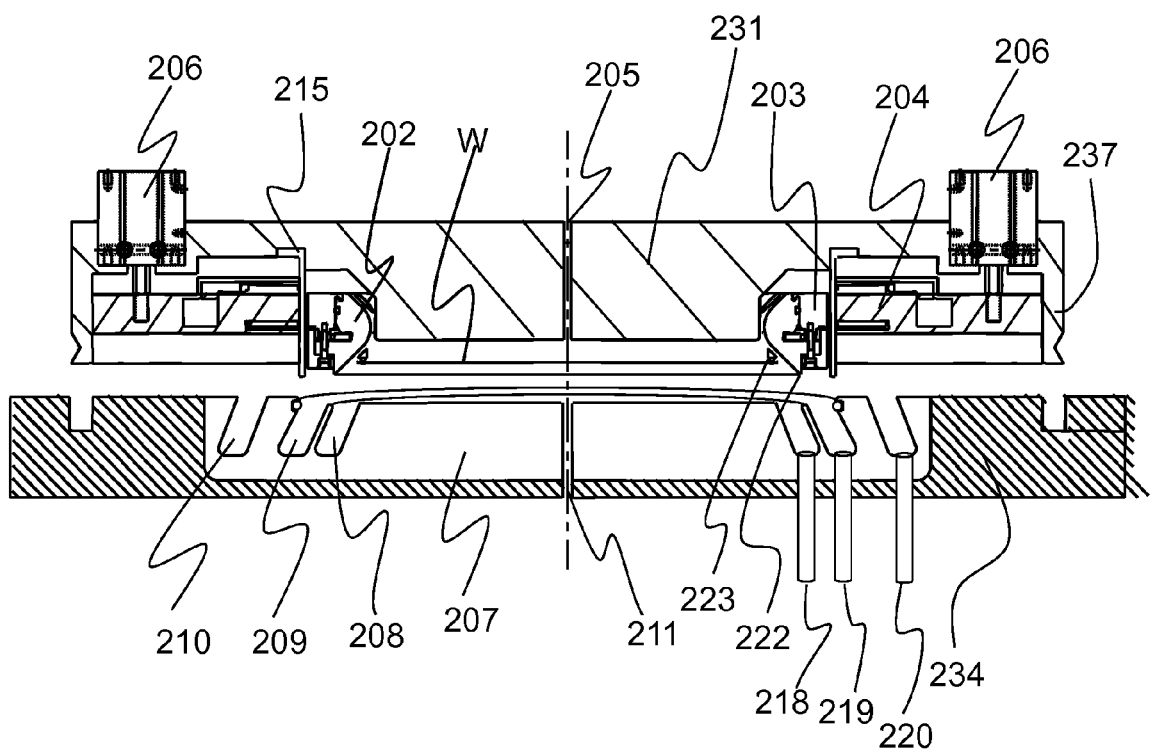
Figure 2C:
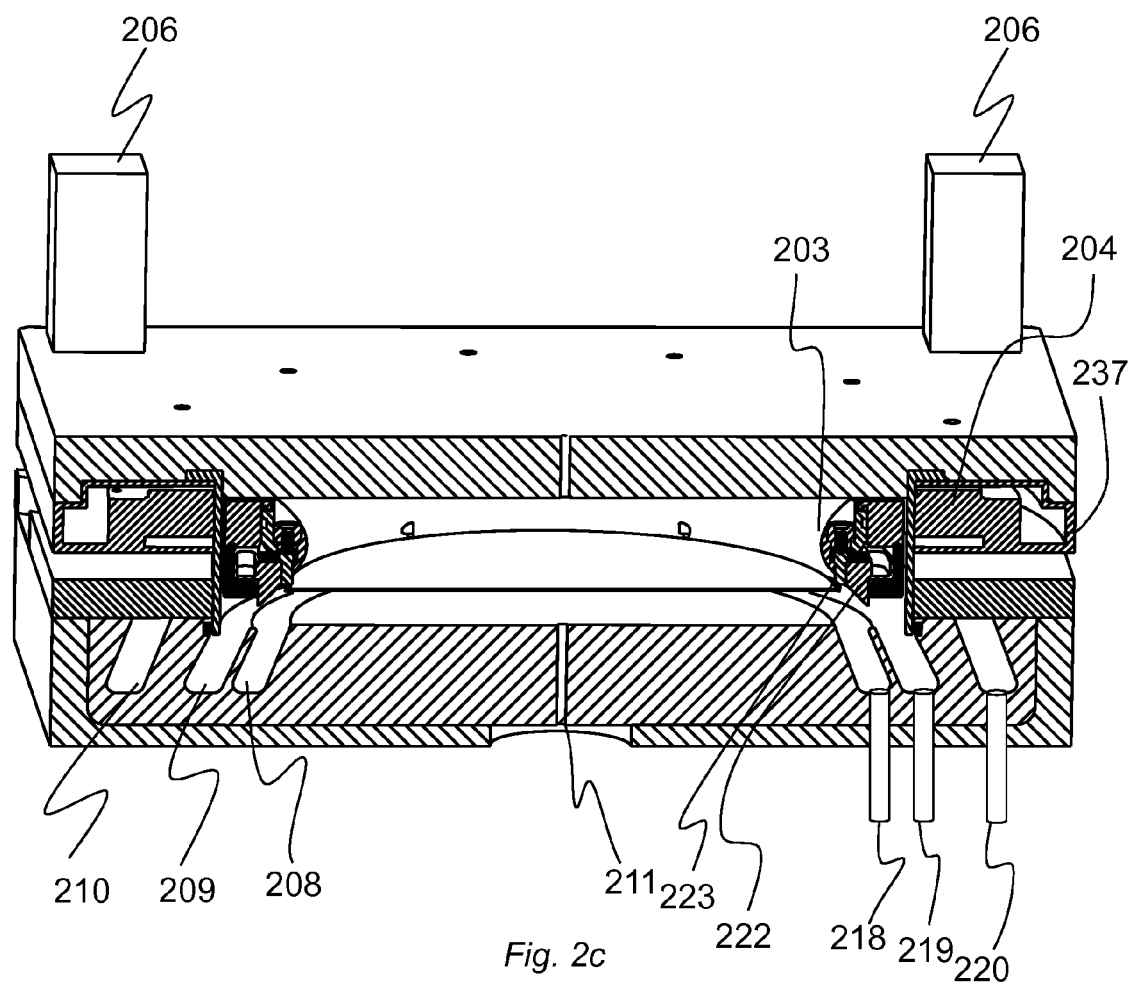
FIG. 2c is a cross-sectional perspective view of the process chamber of FIG. 2a, shown in a first process fluid collection status.
Figure 2D:
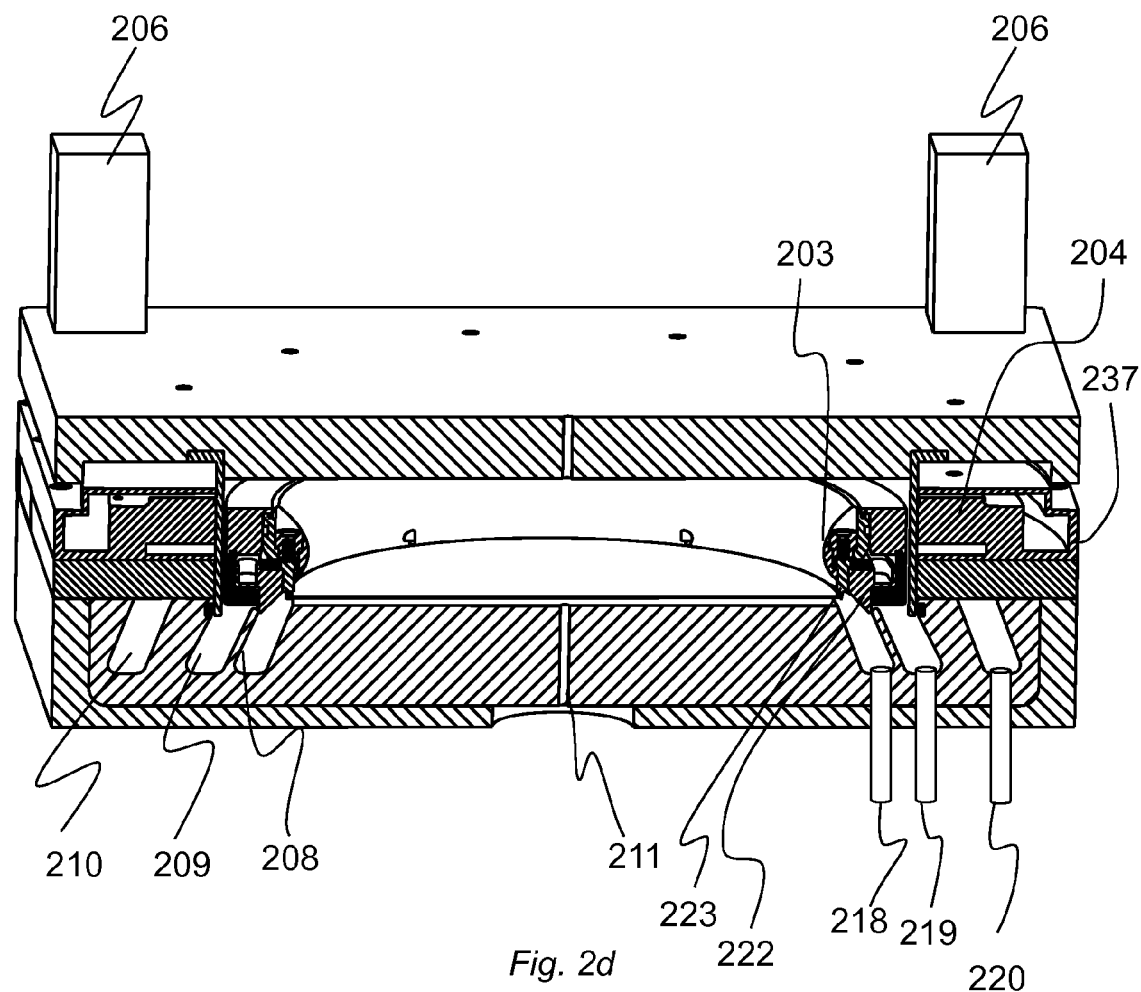
FIG. 2d is a cross-sectional perspective view of the process chamber of FIG. 2a, shown in a second process fluid collection status.

In FIGS. 1f and 1g, modified splash guards (115a and 111a) are shown. In this embodiment, the outer splash guard (111a) includes an inwardly extending upper surface which overlies and engages an upper edge of the inner splash guard (115a) when the inner splash guard (115a) is elevated. Thus, the outer fluid collector can be essentially sealed by the inner splash guard (115a) when the inner fluid collector is in use.

FIGS. 1f and 1g also show further details of an embodiment of the actuator for each splash guard within the closed process chamber. In this embodiment, with respect to the inner splash guard 115a), a piston (1160) is selectively driven by a lifting mechanism (116a) which can be, for example, a ball spindle or pneumatic lifting cylinder. The piston (1160) extends through an aperture in the bottom plate of the closed process chamber. Within the closed process chamber, the piston (1160) is covered by a cylinder shaped cover (1162), which cylinder shaped cover (1162) is sealed at its end distal to the bottom plate by a cylinder cap and is sealed at its end proximal to the bottom plate against an inner surface of the closed process chamber.

An inner magnet (1164) is attached to the piston (1160) and located in operative association with an outer ring-shaped magnet (1166) that is attached to the splash guard (115a). The inner magnet (1164) and outer ring-shaped magnet (1166) correspond to each other so that when the piston (1160) is raised or lowered by the lifting mechanism (116a), the splash guard (115a) is raised or lowered in a corresponding manner.

Another embodiment of the invention is depicted in FIGS. 2a-2d in which the functionality of the vertically movable splash guards is replaced with a mechanism for selective vertical movement of the ring chuck.

In this embodiment, a closed process chamber is defined by an interior region bounded by an upper plate (231), a lower plate (234) and a cylindrical chamber wall (215) which extends vertically between opposing surfaces of the upper plate (231) and lower plate (234).

A magnetically coupled and driven ring chuck (202) adapted to support a wafer (W), via a plurality of eccentrically movable pins (223), is located within the interior of the cylindrical chamber wall (215). A rotor (203) associated with the ring chuck (202) is located adjacent the interior surface of the cylindrical chamber wall (215) and is operatively associated with a corresponding stator (204), which is located adjacent the exterior surface of the cylindrical chamber wall (215). Stator (204) is carried by a carrier plate (237).

A chamber bottom (207) is located within the closed process chamber on the interior surface of the lower plate (234). The chamber bottom (207) accommodates a plurality of process fluid collectors provided as concentric annular ducts (208-209), each leading to a corresponding outlet (218-219) which extends from the annular duct to outside the closed process chamber. Preferably, each annular duct is slanted relative to the horizontal such that any process fluid collected therein is delivered to the corresponding outlet. The chamber bottom (207) also accommodates an annular exhaust duct (210) and corresponding exhaust outlet (220).

Apertures (205 and 211) are provided in the upper plate (231) and plate bottom (207) such that process fluid may selectively be delivered to either or both sides of a spinning wafer undergoing processing.

In this embodiment, the stator (204) and carrier plate (237) are mounted so as to be vertically movable relative to the cylindrical chamber wall (215). Accordingly, vertical movement of the stator (204) causes, via a magnetic couple with the rotor (203), a corresponding vertical movement of the ring chuck (202) and a wafer being held thereby. Selective vertical movement of the stator (204) is provided by actuators (206).

The ring chuck (202) includes a trailing edge (222) which is oriented at a downward angle directed radially outward from the rotational axis of the ring chuck (202). Thus, centrifugal action created by a spinning wafer causes excess process fluid, which has been dispensed through medium inlet (205) or (211), to be driven against an angled surface of the ring chuck (202) and directed in a downward and outward direction from the trailing edge (222).

In use, the stator (204) is positioned at a selected elevation relative to the cylindrical chamber wall (215), such that the ring chuck (202) is positioned at a corresponding elevation, which elevation is selected so that any excess fluid emanating from the trailing edge (222) will be directed into a desired annular duct.

When a different process fluid is to be applied, the ring chuck (202) is moved in a vertical direction, via a corresponding vertical movement of the stator (204), to a position at which any excess fluid emanating from the trailing edge (222) will be directed into a different desired annular duct.

In this manner, the ring chuck (202) may be selectively positioned in the vertical direction such that any given process fluid will be directed from the wafer to a selected annular duct and outlet, so that excess of each process fluid may be separately captured for recycling or reuse.

While the present invention has been described in connection with various illustrative embodiments thereof, it is to be understood that those embodiments should not be used as a pretext to limit the scope of protection conferred by the true scope and spirit of the appended claims.

What is claimed is:

1. Device for processing wafer-shaped articles, comprising a closed process chamber, a ring chuck located within said closed process chamber, and at least one process fluid collector in fluid communication through a bottom wall of the closed process chamber to the outside of the closed process chamber, wherein said ring chuck is adapted to be driven without physical contact through a magnetic bearing, wherein said ring chuck and said at least one process fluid collector are vertically movable relative to each other, and wherein the at least one process fluid collector comprises a vertically movable splash guard.

2. The device according to claim 1, wherein the ring chuck is fixed in the vertical direction.

3. The device according to claim 2, comprising a plurality of process fluid collectors, each process fluid collector comprising a vertically movable splash guard.

4. The device according to claim 3, further comprising lifting mechanisms mounted outside the closed process chamber and configured to drive each vertically movable splash guard selectively to a predefined vertical position.

5. The device according to claim 4, wherein each vertically movable splash guard is selectively positionable so as to deflect a preselected process fluid emanating from a spinning wafer carried by said ring chuck.

6. The device according to claim 5, further comprising a vertical movement actuator operatively associated with each vertically movable splash guard.

7. The device according to claim 6, wherein said actuator is operatively associated with said vertically movable splash guard through a magnetic couple.

8. The device according to claim 1, wherein the magnetic bearing is an active magnetic bearing.

9. The device according to claim 1, wherein said closed process chamber comprises a wafer loading and unloading access door provided in a sidewall of said closed process chamber at a vertical position lower than a vertical position of said ring chuck.

10. The device according to claim 3, wherein said plurality of process fluid collectors comprises an annular inner splash guard and a radially outer annular splash guard that is concentric to said annular inner splash guard.

11. The device according to claim 3, wherein said plurality of process fluid collectors comprises an inner process fluid collector having an inner splash guard and an outer process fluid collector having an outer splash guard, and wherein said outer splash guard comprises an inwardly extending upper surface which overlies and engages an upper edge of said inner splash guard when said inner splash guard is elevated, thereby essentially to seal said outer process fluid collector by said inner splash guard when said inner process fluid collector is in use.

12. The device according to claim 1, wherein said vertically movable splash guard comprises an inwardly facing upper lip that is seated against an interior surface of said closed process chamber in an uppermost position of said vertically movable splash guard.

13. The device according to claim 1, wherein said vertically movable splash guard comprises an inwardly facing upper lip that is seated against a trailing edge of said ring chuck in an uppermost position of said vertically movable splash guard.

* * * * *